(12) United States Patent
Koh et al.

(10) Patent No.: US 7,217,616 B2
(45) Date of Patent: May 15, 2007

(54) NON-VOLATILE MEMORY CELL AND METHOD OF FORMING THE SAME

(75) Inventors: Chao-Ming Koh, Hsinchi (TW); Jia-Ching Doong, Kaohsiung (TW); Gia-Hua Hsieh, Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 11/481,043

(22) Filed: Jul. 6, 2006

(65) Prior Publication Data

US 2006/0258101 A1 Nov. 16, 2006

Related U.S. Application Data

(62) Division of application No. 10/828,231, filed on Apr. 21, 2004, now Pat. No. 7,115,938.

(51) Int. Cl.
*H01L 21/8242* (2006.01)

(52) U.S. Cl. .................. 438/239; 438/250; 438/251; 438/252; 257/E21.048; 257/E21.19; 257/E21.396

(58) Field of Classification Search ............... 438/239, 438/250–252; 257/E21.048, E21.19, E21.396
See application file for complete search history.

(56) References Cited

U.S. PATENT DOCUMENTS

| | | | |
|---|---|---|---|
| 4,173,819 A | 11/1979 | Kinoshita et al. | |
| 4,295,264 A | 10/1981 | Rogers | |
| 4,419,682 A | 12/1983 | Masuoka et al. | |
| 5,962,887 A | 10/1999 | Manning et al. | |
| 6,191,980 B1 | 2/2001 | Kelley et al. | |
| 6,661,705 B1 * | 12/2003 | McPartland et al. | 365/185.05 |
| 2004/0217444 A1 | 11/2004 | Ooms et al. | |

* cited by examiner

*Primary Examiner*—Jerome Jackson
*Assistant Examiner*—Matthew E. Warren
(74) *Attorney, Agent, or Firm*—Birch, Stewart, Kolasch & Birch, LLP

(57) ABSTRACT

A non-volatile memory cell comprising a transistor and two plane capacitors. In the memory cell, a switching device is disposed on a substrate, a first plane capacitor having a first doped region and a second plane capacitor having a second doped region. The switching device and the first and second plane capacitors share a common polysilicon floating gate configured to retain charge as a result of programming the memory cell. The memory cell is configured to be erased by tunneling between the first doped region and the common polysilicon floating gate without causing junction breakdown within the memory cell. The first and second doped regions are formed in the substrate before forming the common polysilicon floating gate such that the capacitance of the first and second plane capacitors are constant when the memory cell operates within an operating voltage range.

1 Claim, 7 Drawing Sheets

NON-VOLATILE MEMORY CELL AND METHOD OF FORMING THE SAME

This application is a Divisional of application Ser. No. 10/828,231, filed on Apr. 21, 2004, now U.S. Pat. No. 7,115,938 and for which priority is claimed under 35 U.S.C. § 120, the entire contents of which are hereby incorporated by reference.

BACKGROUND OF THE INVENTION

1. Field of the Invention

The present invention relates to a memory cell, and more particularly, to a non-volatile memory cell comprising a transistor and two plane capacitors, wherein the capacitance of the two plane capacitors are constant when the memory cell operates within in an operating voltage range.

2. Description of the Related Art

A non-volatile memory device is capable of retaining stored information after disconnection of its power source. An EEPROM is a type of non-volatile memory device in which information is written and erased from the memory cell thereof using an electrical signal. Such devices typically utilize floating gate transistors in which the floating gate stores charge when the memory cell is programmed.

FIG. 1 shows a schematic diagram of a single-poly flash EEPROM memory cell 100 disclosed in U.S. Pat. No. 6,191,980. The memory cell 100 includes a PMOS transistor MC1, a NMOS transistor M2 and an eraser M3. The PMOS transistor MC1, the NMOS transistor M2 and the eraser M3 all share a common polysilicon floating gate 206. To further increase the coupling between the control gate and the floating gate, a capacitor C1 is added to the memory cell. Because the EEPROM cell is programmed and erased by transistor structures, a P-well and N-well are both required in the EEPROM cell, however, size thereof is large and a large wafer area is required.

SUMMARY OF THE INVENTION

It is therefore an object of the present invention is to minimize the area require for the memory cells in the memory device, thereby minimizing fabrication cost.

According to the above mentioned objects, the present invention provides a non-volatile memory cell. In the non-volatile memory cell, a switching device is disposed on a substrate, a first plane capacitor having a first doped region and a second plane capacitor having a second doped region. The switching device and the first and second plane capacitors share a common polysilicon floating gate configured to retain charge resulting from programming of the memory cell. The memory cell is configured to be erased by causing tunneling between the first doped region and the common polysilicon floating gate without causing any junction breakdown within the memory cell. The first and second doped regions are formed in the substrate before forming the common polysilicon floating gate such that the capacitance of the first and second plane capacitors are constant when the memory cell operates within in an operating voltage range.

According to the above object, the present invention also provides a fabrication method for a non-volatile memory cell. In the method, a first active area, a first element region and a second element region are defined in a substrate. The first and second element regions are then heavily doped to form a first heavily doped region and a second heavily doped region. A floating gate is then formed on the first and second heavily doped regions and the first active area. The floating gate and the first heavily doped region form a first plane capacitor and the floating gate and the second heavily doped region form a second plane capacitor. The first active area is then doped to form a drain region and a source region for a switching device using the floating gate as a mask. The capacitances of the first and second plane capacitors are constant when the non-volatile memory cell is operated within an operating voltage range.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein:

FIG. 4b shows the CV curve of the MOS capacitors as shown in FIG. 4a;

DETAILED DESCRIPTION OF THE INVENTION

Figure 2:
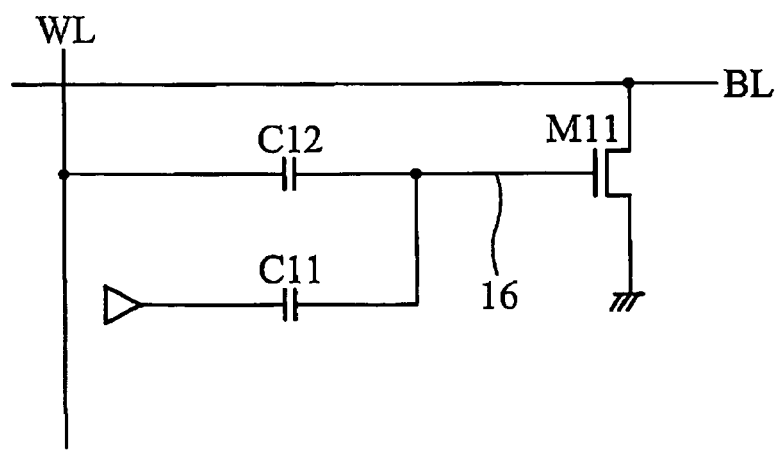
FIG. 2 is a diagram of the non-volatile memory cell.
Figure 3:
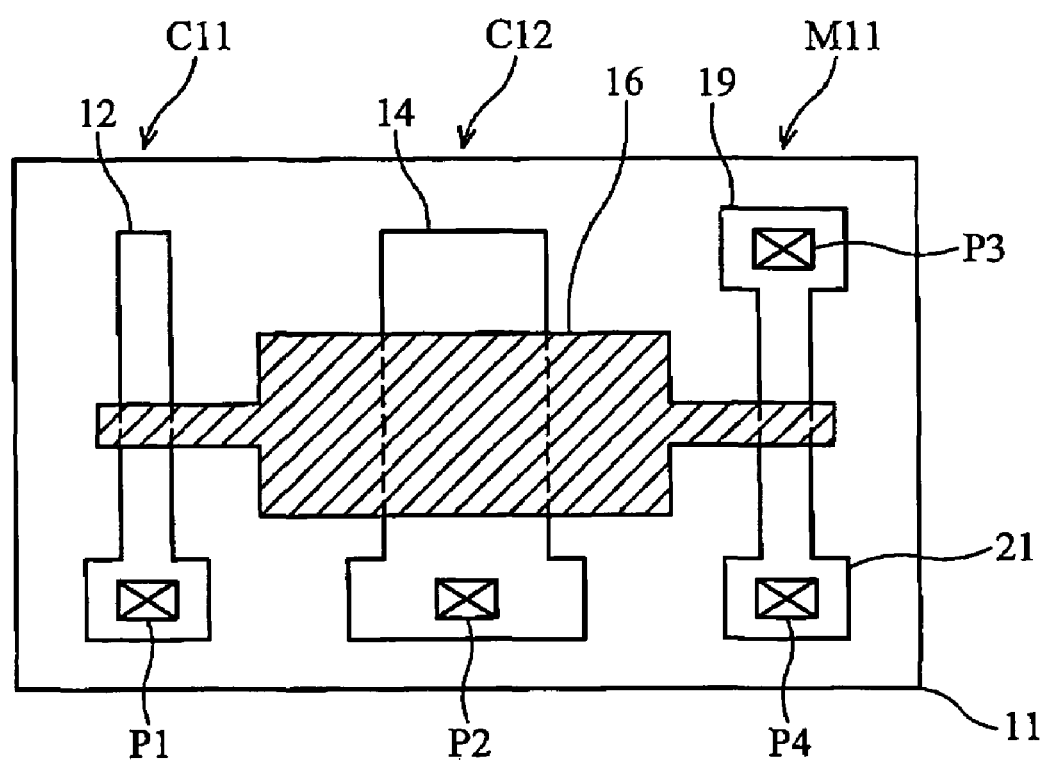
FIG. 3 is a structural diagram of the non-volatile memory cell according to the present invention.

FIG. 2 is a diagram of the non-volatile memory cell according to the present invention. FIG. 3 is a structural diagram of the non-volatile memory cell according to the present invention. As shown in FIG. 2, the non-volatile memory cell 10 includes a switching device M11, a first plane capacitor C11 and a second plane capacitor C12. In this case, the switching device is a NMOS transistor, disposed on the substrate 11 as shown in FIG. 3. The source 19 and the drain 21 are coupled to ground and the bit line BL (shown in FIG. 2) respectively via contacts P3 and P4. The first and second plane capacitors C11 and C12 have a first doped region 12 and a second doped region 14 10 respectively. The second doped region (bottom electrode) 14 is coupled to the word line (shown in FIG. 2) via the contact P2.

The switching device M11 and the first and second plane capacitors C1 and C2 share a common polysilicon floating gate 16 to retain charge resulting from programming of the memory cell. The non-volatile memory cell 10 is configured to be erased by causing tunneling between the first doped region 12 and the common polysilicon floating gate 16 without causing any junction breakdown within the non-volatile memory cell 10. Additionally, the first and second doped regions 12 and 14 are formed in the substrate 11 before forming the command polysilicon floating gate 16 such that the capacitances of the first and second plane capacitors C11 and C12 are constant when the non-volatile memory cell 10 operates within an operating voltage range. In the present invention, the non-volatile memory cell 10 is programmed, read or erased by voltages within an operating voltage range.

The non-volatile memory cell 10 is programmed by hot electron injection and is erased by Fowler-Nordheim (FN) tunneling. When operating, the memory cell 10 is written or programmed by applying a voltage of between 4V~10V to the drain of the switching device M11 and the second doped region 14, and the source of the switching device M11 and the first doped region 12 of the first plane capacitor C11 are held to 0 volts. In this embodiment, 5 volts is preferably applied to the drain of the switching device M11 and the second doped region 14 during programming. At this time, hot electrons are induced and injected into the coupled floating gate 16.

Additionally, the objective of an erasure operation is to raise the potential of the floating gate 16. When operating, the memory cell 10 is erased by applying a voltage of about 10 volts to the first doped region 12 of the first plane capacitor C11 while the drain and source of the switching device and the second doped region of the second plane capacitor C12 are held to about 0 volts. At this time, Fowler-Nordheim (FN) tunneling is produced between the first doped region 12 and the floating gate 16 such that the electrons retained in the floating gate 16 can be removed.

Figure 1:
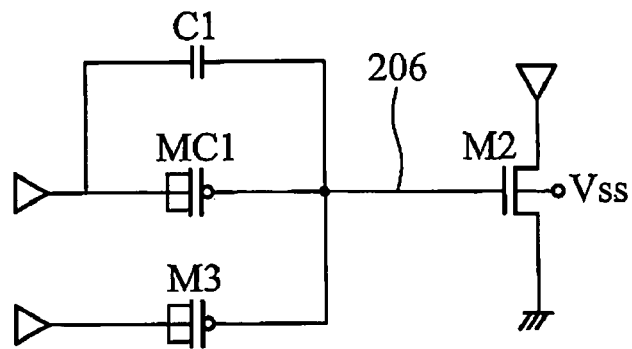
FIG. 1 is a diagram of a conventional EEPROM cell.
Figure 4A:
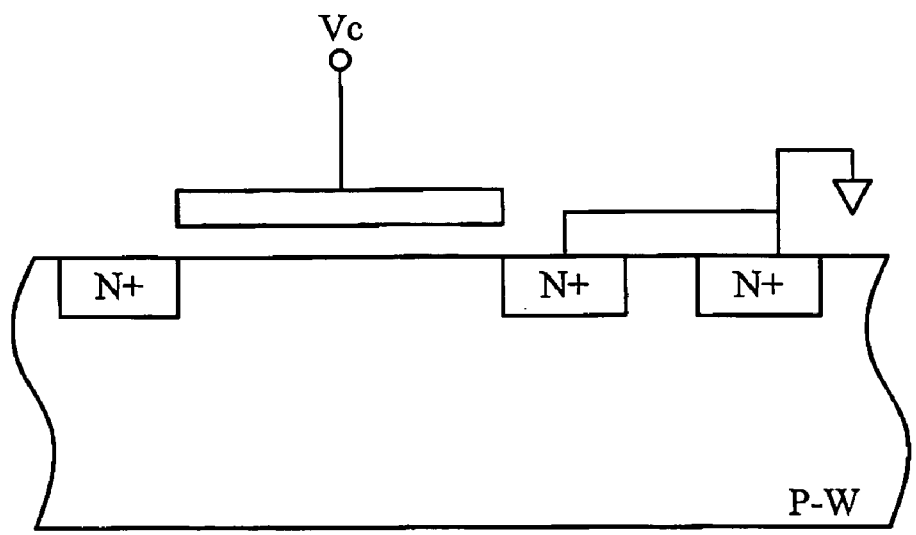
FIG. 4a shows the structure of the MOS capacitor MC1 and M3.
Figure 4B:
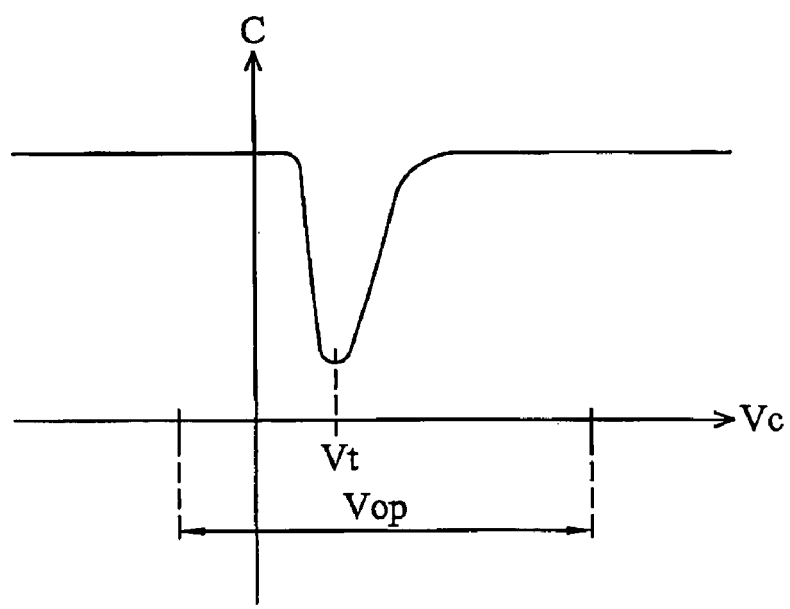

In FIG. 1, the conventional memory cell is operated by the MOS capacitors MC1 and M3. FIG. 4a shows the structure of the MOS transistors MC1 and M3. Because MOS capacitors have channels, capacitances of the MOS capacitors MC1 and M3 vary according to the voltage Vc thereon and are not constant during programming, reading, or erasing of the memory cell. For example, when the voltage Vc on the MOS capacitor approaches the threshold voltage thereof, an inversion layer is produced in the channel of the MOS capacitor such that the equivalent capacitance is lowered as shown in FIG. 4b. Therefore, the equivalent capacitance of the MOS capacitor varies during the operation of memory cell by the voltage within an operating voltage range Vop for programming, erasing or reading.

Figure 4C:
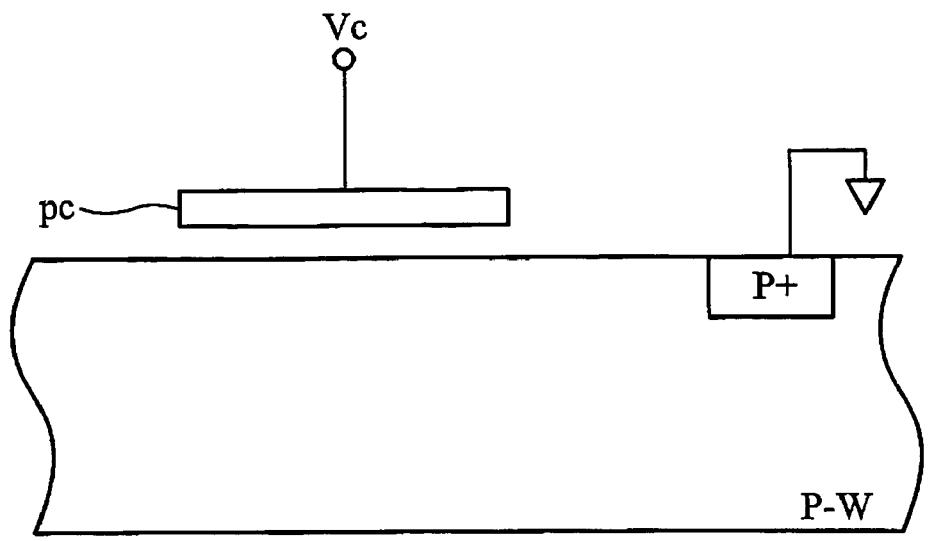
FIG. 4c shows the structure of the capacitor C1 as shown in the FIG. 1.
Figure 4D:
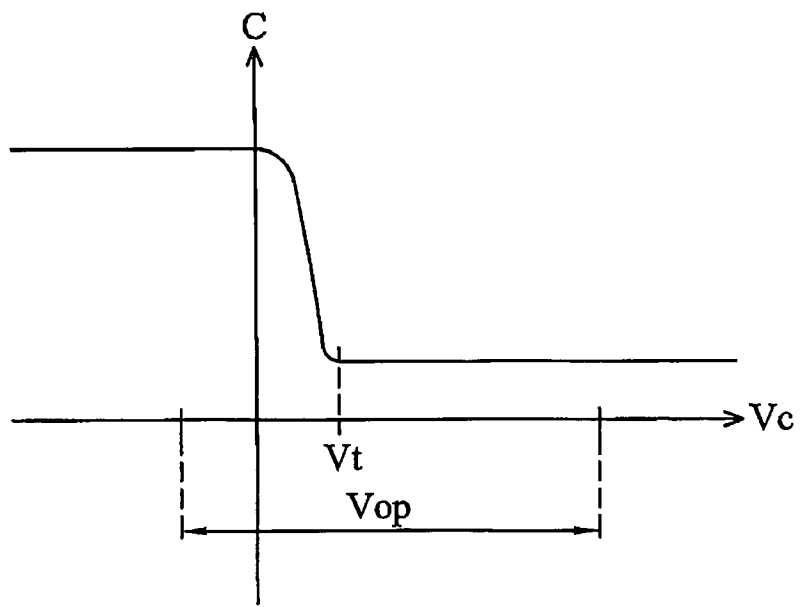
FIG. 4d shown the CV curve of the capacitor C1 as shown in FIG. 1.

Further, FIG. 4c shows the structure of the capacitor C1 of FIG. 1. The capacitor C1 is composed of a polysilicon layer PC, the p-well P-W and the oxide therebetween. An depletion region is induced in the p-well P-W such that the equivalent capacitance is lowered as shown in FIG. 4d when the voltage Vc on the capacitor C1 exceeds the threshold voltage Vt. The threshold voltage Vt that caused the depletion region is still within the operating voltage range Vop of the memory cell because the p-well is typically not heavily doped region. Therefore, the equivalent capacitance of the capacitor C1 as shown in FIG. 1 also varies during operation of the memory cell by the voltage ranged within an operating voltage range Vop for programming, erasing or reading.

Figure 4E:
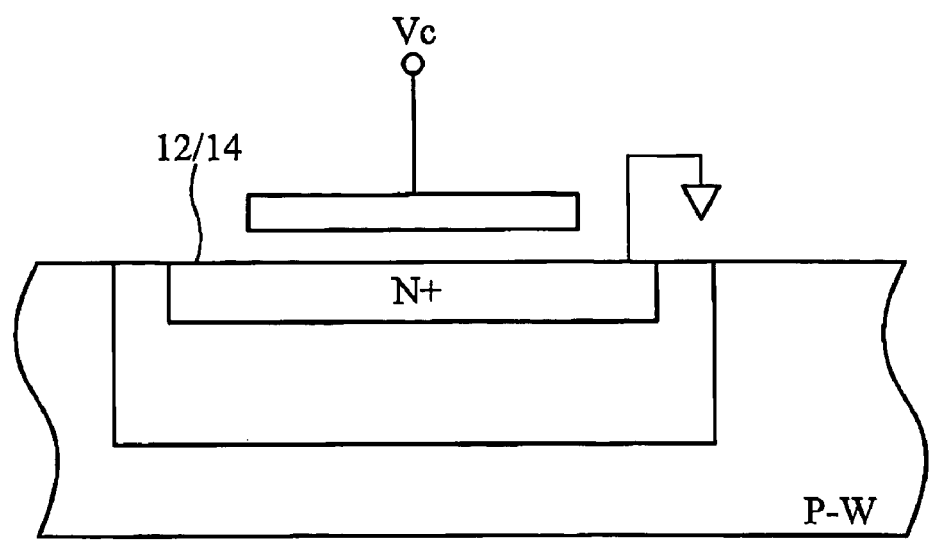
FIG. 4e shows the structure of the plane capacitors according to the present invention.
Figure 4F:
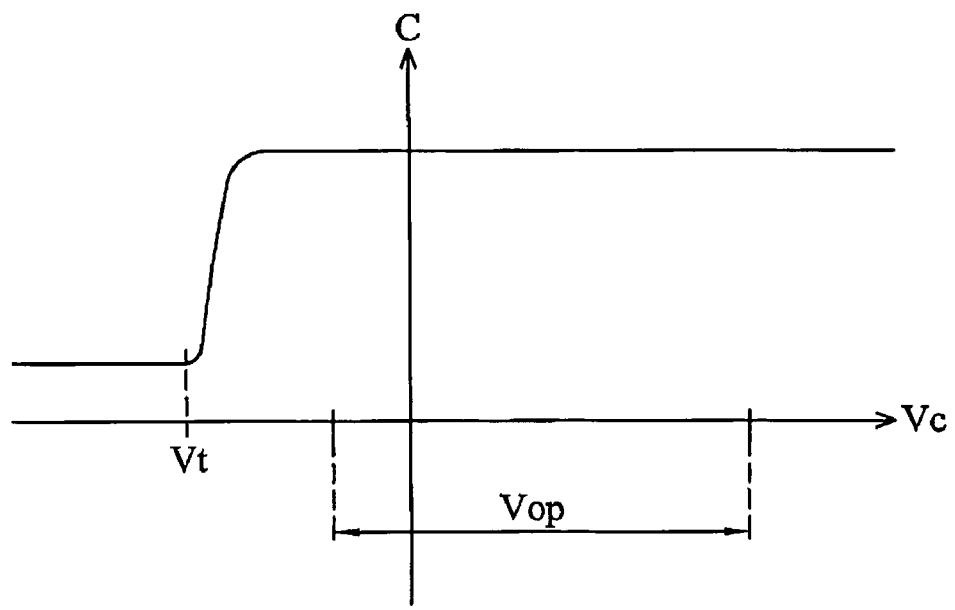
FIG. 4f shows the CV curve of the plane capacitors according to the present invention.

In the present invention, however, the memory cell 10 is operated using first and second plane capacitors C11 and C12, and the bottom electrodes are the heavily doped regions 12 and 14 respectively, as shown in FIG. 4e. Because the bottom electrodes of the plane capacitors C11 and C12 are heavily doped regions (N+), a large negative voltage is required across the plane capacitor in order to vary the equivalent capacitance caused by the depletion region. Such large negative voltage may exceed the operating voltage range Vop of the memory cell 10. Therefore, the capacitances of the plane capacitors C12 and C12 are constant and do not vary as shown in FIG. 4f when the memory cell 10 is operated by the voltage within the operating voltage range Vop. Consequently, the capacitor C1 and MOS capacitors MC1 and M3 do not meet the first and second plane capacitors C11 and C12 as defined in the present invention.

Furthermore, when the conventional memory cell is operated within the operating voltage range Vop, the size of the capacitor C1 and MOS capacitor MC1 and M3 must be increased in order to obtain the same capacitive coupling as the present invention. Hence, the required area is increased, and thus, fabrication cost is increased. The present invention, however, utilizes plane capacitors rather than MOS capacitor for memory cell operation. Thus, the memory cell of the present invention requires a less area and the fabrication cost thereof can be reduced.

Figure 5A:
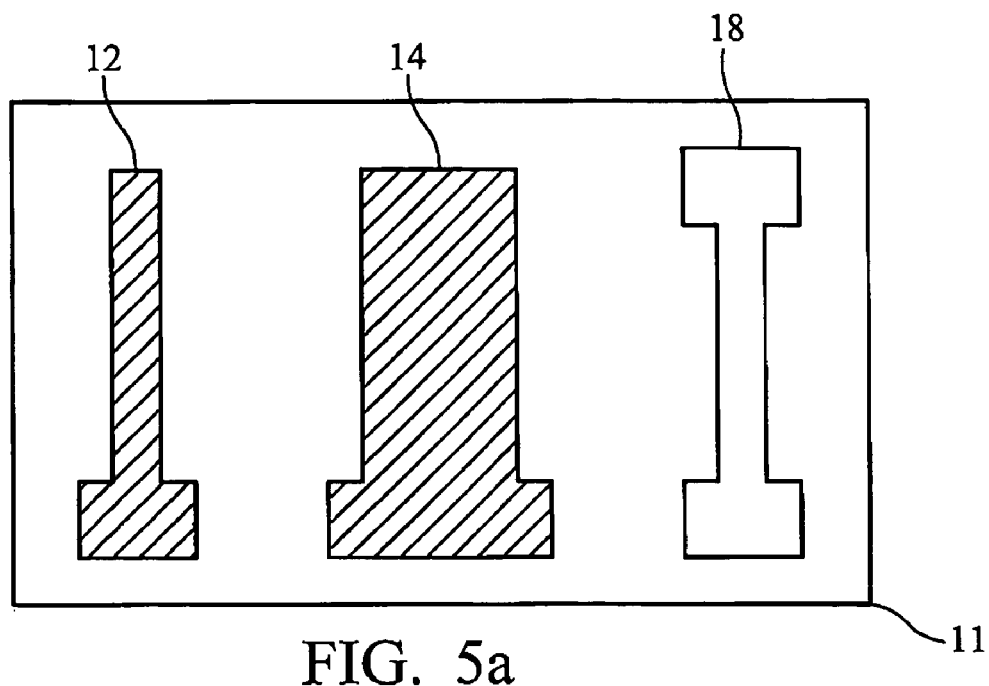
FIGS. 5a~5c are flowcharts of the fabrication method according to the present invention.
Figure 5B:
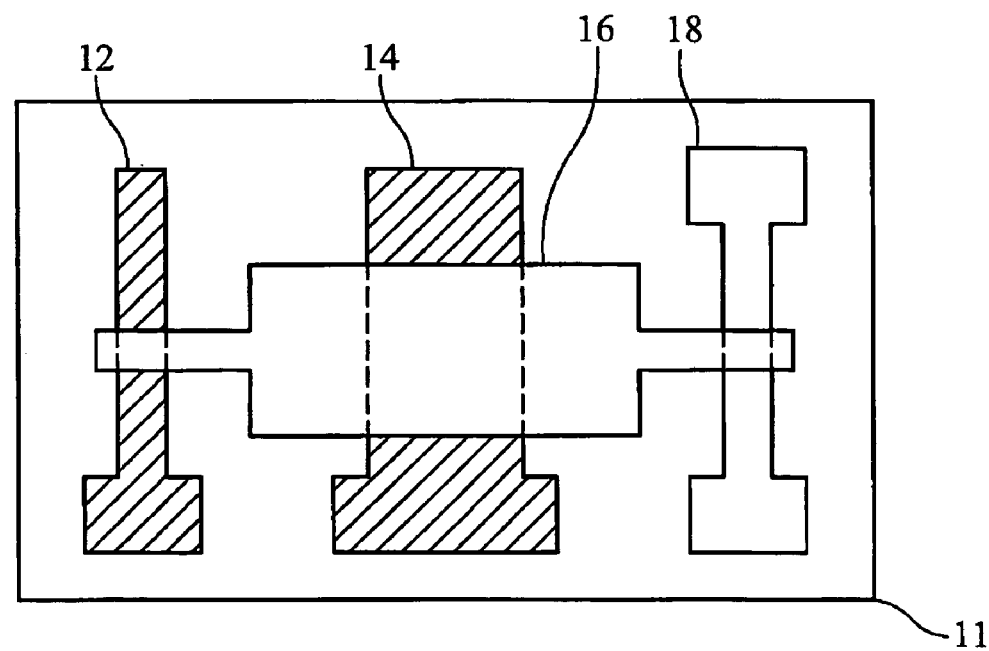
Figure 5C:
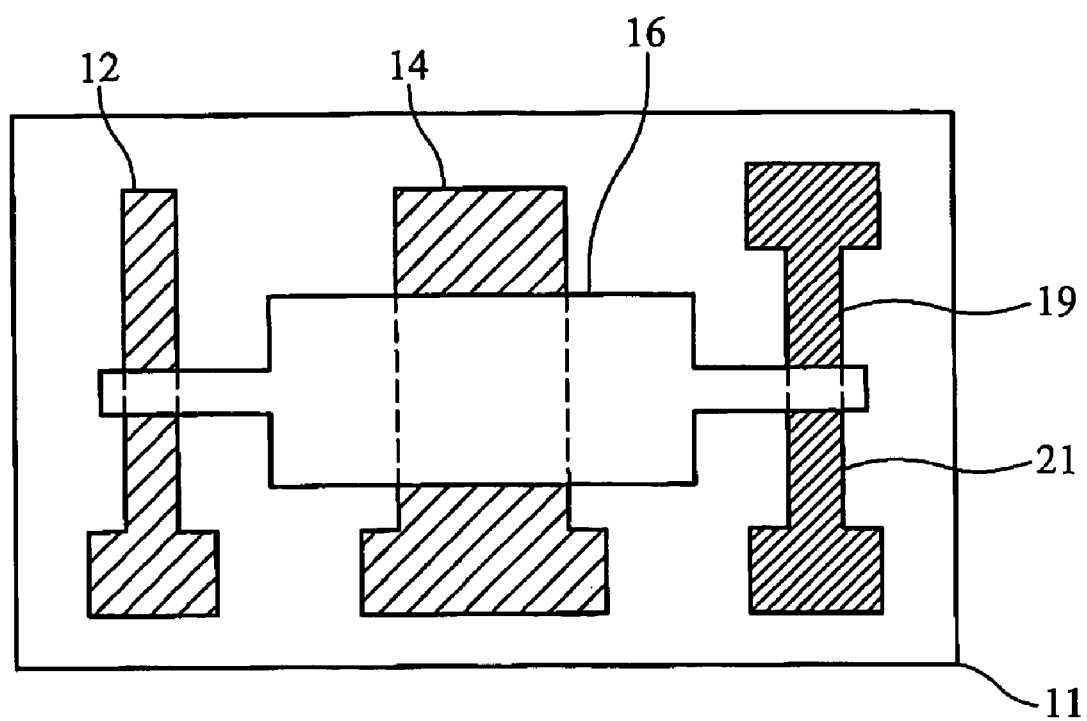

The present invention also provides a fabrication method for the non-volatile memory cell. FIGS. 5a to 5c show a flowchart of the present invention.

First, an active area 18, a first element region and a second element region are defined in the substrate 11. The first and second element regions are then heavily doped to form a first heavily doped region 12 and a second heavily doped region 14 as shown in FIG. 5a.

Next, as shown in 5b, a common polysilicon floating gate 16 and gate oxide (not shown) are formed on the first and second heavily doped regions 12 and 14 and the first active area 18. The polysilicon floating gate 16, the first heavily doped region 12 and gate oxide (not shown) therebetween form a first plane capacitor C11. The polysilicon floating gate 16, the first heavily doped region 14 and gate oxide (not shown) therebetween form a first plane capacitor C12. The first and second doped regions 12 and 14 are formed in the substrate 11 before forming the common polysilicon floating gate 16 such that the capacitances of the first and second plane capacitors C11 and C12 are constant when the memory cell 10 operates within an operating voltage range Vop, of for example −5V~10V.

Finally, the active area 18 is doped using the polysilicon floating gate as a mask to form a drain 19 and source 21 for a switching device M11, as shown in FIG. 5c.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fabrication method for a non-volatile memory cell, comprising the step of:

defining a first active area, a first element region and a second element region in a substrate;

heavily doping the first and second element regions to form a first heavily doped region and a second heavily doped region;

forming a floating gate on the first and second heavily doped regions and the first active area, wherein the floating gate and the first heavily doped region form a first plane capacitor and the floating gate and the second heavily doped region form a second plane capacitor; and doping the first active area using the floating gate as a mask to form a drain region and a source region for a switching device, wherein the capacitance of the first and second plane capacitors are constant when the non-volatile memory cell is operated within an operating voltage range.

* * * * *